United States Patent

[11] 3,585,526

[72] Inventor Robert Zelinka
Lippstadt, Germany

[21] Appl. No 831,936
[22] Filed June 10, 1969
[45] Patented June 15, 1971
[73] Assignee Siemens Aktiengesellschaft
Berlin, Germany
[32] Priority June 20, 1968
[33] Germany
[31] P 17 62 456.5

[54] ASTABLE MULTIVIBRATOR HAVING A SWEEP FREQUENCY STABILIZED BY A CRYSTAL OSCILLATOR
4 Claims, 1 Drawing Fig.

[52] U.S. Cl. .......... 331/113, 307/271, 331/116, 331/144, 332/14
[51] Int. Cl. .......... H03k 3/282
[50] Field of Search .......... 331/4, 47, 116, 113, 55, 175, 18, 144, 159; 332/14, 11 T; 307/271

[56] References Cited

UNITED STATES PATENTS

| | | | |
|---|---|---|---|
| 2,695,960 | 11/1954 | Harrison | 331/144 |
| 3,217,269 | 11/1965 | Rowley et al. | 331/113 |
| 3,264,579 | 8/1966 | Marcus | 331/113 |

*Primary Examiner*—Alfred L. Brody
*Attorneys*—Curt M. Avery, Arthur E. Wilfond, Herbert L. Lerner and Daniel J. Tick

ABSTRACT: A bistable complementary multivibrator is connected to an astable control multivibrator whose sweep frequency is stabilized by a crystal oscillator. The transistors of the complementary multivibrator are connected to the collector electrodes of the transistors of the control multivibrator and are connected in mutual feedback relation with elimination of interpolation of components.

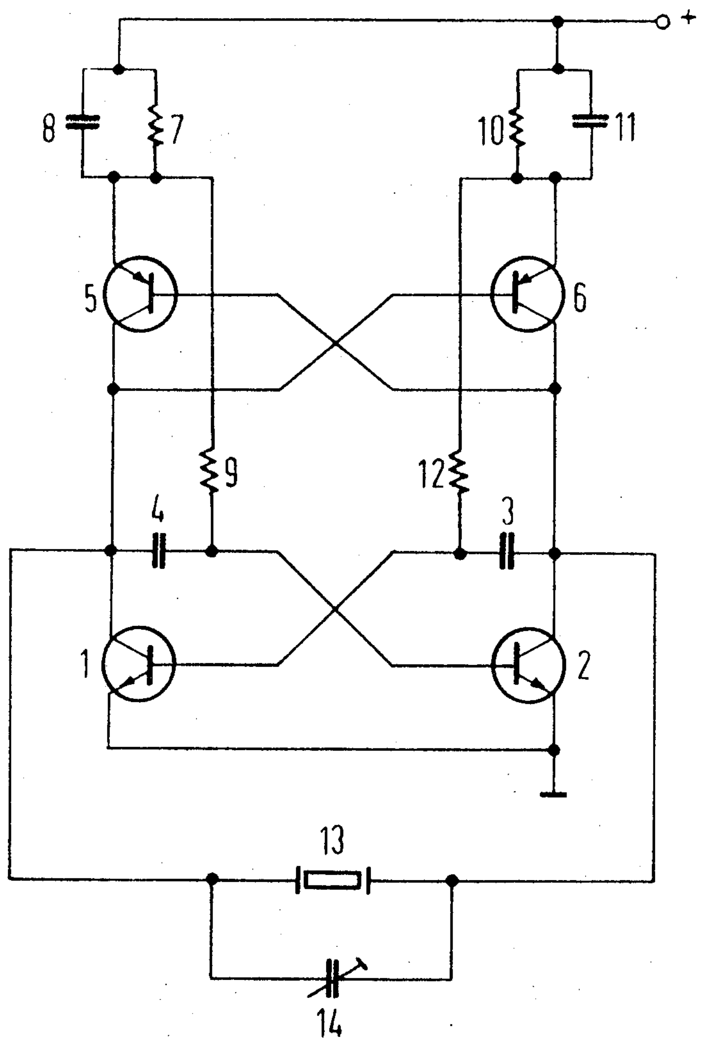

ASTABLE MULTIVIBRATOR HAVING A SWEEP FREQUENCY STABILIZED BY A CRYSTAL OSCILLATOR

DESCRIPTION OF THE INVENTION

The present invention relates to an astable multivibrator. More particularly, the invention relates to an astable multivibrator having a sweep frequency stabilized by a crystal oscillator.

An astable multivibrator is known and described for example, in "Electronics Letters," Aug. 1967, Vol. 3, No. 8, pages 355and 356.

The principal object of the present invention is to provide a new and improved astable multivibrator having a stabilized sweep frequency.

An object of the present invention is to provide a frequency-stabilized astable multivibrator which, on one hand, absorbs the least possible current and, on the other hand, has low ohmic resistance, which is favorable for integrating purposes. These two requirements are difficult to meet with known multivibrators, since either the ohmic resistances would have to be increased in order to reduce the current, or the current flowing through the respectively conducting transistor would be unjustifiably high at low ohmic resistances.

An object of the present invention is to provide a frequency-stabilized astable multivibrator which overcomes the disadvantages of known similar multivibrators and operates with efficiency, effectiveness and reliability.

In accordance with the present invention, an astable multivibrator circuit having a sweep frequency stabilized by a crystal oscillator comprises an astable control multivibrator having first and second transistors each having emitter, collector and base electrodes. A crystal oscillator is coupled to the control multivibrator for stabilizing the sweep frequency thereof. A bistable complementary multivibrator has third and fourth transistors complementary to the first and second transistors of the control multivibrator and connected to the collector electrodes of the first and second transistors. Each of the third and fourth transistors has emitter, collector and base electrodes. The third and fourth transistors are connected in mutual feedback relation with elimination of interpolation of components. The emitter electrode of the third transistor is connected to the base electrode of the second transistor via a first resistor and is coupled to a source of supply voltage. The emitter electrode of the fourth transistor is connected to the base electrode of the first transistor via a second resistor and is coupled to the source of supply voltage. The collector electrode of each of the third and fourth transistors is directly connected to the base electrode of the other.

The emitter electrode of the third transistor is coupled to the source of supply voltage via a third resistor and the emitter electrode of the fourth transistor is coupled to the source of supply voltage via a fourth resistor.

A first capacitor is connected in parallel with the third resistor. A second capacitor is connected in parallel with the fourth resistor. The emitter electrode of the third transistor is coupled to the source of supply voltage via the parallel connection of the third resistor and the first capacitor and the emitter electrode of the fourth transistor is coupled to the source of supply voltage via the parallel connection of the fourth resistor and the second capacitor.

The emitter electrodes of the first and second transistors are connected in common and the crystal oscillator is connected to the collector electrodes of the first and second transistors.

In the astable type of multivibrator of the present invention, there is a very slight current absorption, despite low ohmic resistances, due to the fact that, during the phase in which a transistor of the control multivibrator is conductive, the transistor of the complementary multivibrator, connected to its collector circuit, is in its nonconductive condition and the collector current is limited by the emitter diode of the other transistor of the complementary multivibrator. Only four ohmic resistors are utilized, two of which are determined by the function of the astable control multivibrator, and the other two of which serve simultaneously as a collector resistor of a transistor of the multivibrator and as an emitter resistor of the transistor of the complementary multivibrator, coupled thereto on the collector side. The feedback in the transistors of the complementary multivibrators, due to the mentioned resistors, is decreased in one embodiment of the multivibrator of the present invention, due to the fact that the resistors are bridged by a capacitor.

In order that the present invention may be readily carried into effect, it will now be described with reference to the accompanying drawing, wherein the single FIGURE is a circuit diagram of an astable multivibrator circuit of the present invention.

In the FIGURE, two transistors 1 and 2 are coupled to each other to function as an astable multivibrator. The emitter electrodes of the transistors 1 and 2 are connected to a source of reference potential. The base electrode of the transistor 1 is connected via a capacitor 3 to the collector electrode of the transistor 2. The base electrode of the transistor 2 is connected via a capacitor 4 to the collector electrode of the transistor 1.

The collector electrode of the transistor 1 is connected to the collector electrode of a transistor 5, which is complementary to the transistors 1 and 2, and to the base electrode of a transistor 6 which is also complementary to the transistors 1 and 2. The collector electrode of the transistor 6 is connected to the base electrode of the transistor 5 and to the collector electrode of the transistor 2. The emitter electrode of the transistor 5 is connected, via the parallel connection of an ohmic resistor 7 and a capacitor 8, to a source of supply voltage, and is also connected, via an ohmic resistor 9, to the base electrode of the transistor 2. The emitter electrode of the transistor 6 is connected, via the parallel connection of an ohmic resistor 10 and a capacitor 11, to the source of supply voltage, and is also connected, via an ohmic resistor 12, to the base electrode of the transistor 1. The collector electrodes of the transistors 1 and 2 are connected to each other via a crystal oscillator 13. A variable capacitor 14 is connected across the crystal oscillator 13.

The crystal oscillator 13, which in this known switching operation stabilizes the sweep frequency of the astable control multivibrator, oscillates in parallel resonance. If the oscillator is to oscillate in series resonance, it may be connected into one of the feedback paths of the control multivibrator.

When, for example, transistor 1 is in its conductive condition, the potential of its collector electrode drops down almost to reference potential. A negative voltage pulse is transferred via the capacitor 4 to the base electrode of the transistor 2 and switches said transistor from its conductive condition to its nonconductive condition. The collector electrode of the transistor 2 thus obtains a positive potential, which is transferred to the base electrode of the transistor 5 so that the transistor 5 is switched to its nonconductive condition.

Since the transistor 5 is in its nonconductive condition, it contributes nothing to the collector current of transistor 1, with the exception of the extremely low residual current. The collector current of the transistor 1 is essentially the current flowing across the emitter-base path of the transistor 6. The transistor 6 is switched to its conductive condition, because its base potential and its collector potential drop almost to the reference potential.

The subsequent recharging of the capacitor 4 is via resistors 7 and 9 and permits the transistor 2 to become conductive following the first half period of the oscillation of the multivibrator. As a result, a condition which is symmetrical to the aforedescribed condition of the multivibrator occurs for the second half period. The output oscillation of the astable multivibrator may be derived from the collector electrode of one of the transistors 1 and 2.

While the invention has been described by means of a specific example and in a specific embodiment, I do not wish to be limited thereto, for obvious modifications will occur to those skilled in the art without departing from the spirit and scope of the invention.

I claim:

1. Astable multivibrator circuit having a sweep frequency stabilized by a crystal oscillator, said circuit comprising an astable control multivibrator having first and second transistors each having emitter, collector and base electrodes;

crystal oscillator means coupled to said control multivibrator for stabilizing the sweep frequency thereof;

a bistable complementary multivibrator having third and fourth transistors complementary to the first and second transistors of said control multivibrator and connected to the collector electrodes of said first and second transistors, each of said third and fourth transistors having emitter, collector and base electrodes, means connecting said third and fourth transistors in mutual feedback relation with elimination of interpolation of components;

a source of supply voltage;

a first resistor, the emitter electrode of said third transistor being connected to the base electrode of said second transistor via said first resistor and being coupled to said source of supply voltage; and a second resistor, the emitter electrode of said fourth transistor being connected to the base electrode of said first transistor via said second resistor and being coupled to said source of supply voltage, the collector electrode of each of said third and fourth transistors being directly connected to the base electrode of the other.

2. Astable multivibrator circuit as claimed in claim 1, further comprising a third resistor and a fourth resistor, and wherein the emitter electrode of said third resistor is coupled to said source of supply voltage via said third resistor and the emitter electrode of said fourth transistor is coupled to said source of supply voltage via said fourth resistor.

3. Astable multivibrator circuit as claimed in claim 1, further comprising a third resistor, a first capacitor connected in parallel with said third resistor, a fourth resistor and a second capacitor connected in parallel with said fourth resistor, and wherein the emitter electrode of said third transistor is coupled to said source of supply voltage via the parallel connection of said third resistor and said first capacitor and the emitter electrode of said fourth transistor is coupled to said source of supply voltage via the parallel connection of said fourth resistor and said second capacitor.

4. Astable multivibrator circuit as claimed in claim 3, wherein the emitter electrodes of said first and second transistors are connected in common and said crystal oscillator is connected to the collector electrodes of said first and second transistors.